US012785422B2

(12) United States Patent
Cao et al.

(10) Patent No.: US 12,785,422 B2
(45) Date of Patent: Nov. 3, 2026

(54) CHARGING AND DISCHARGING SYSTEM

(71) Applicant: BYD COMPANY LIMITED, Shenzhen (CN)

(72) Inventors: Hu Cao, Shenzhen (CN); Shaowen Yin, Shenzhen (CN); Xueqin Yin, Shenzhen (CN); Hongyan Guang, Shenzhen (CN)

(73) Assignee: BYD COMPANY LIMITED, Shenzhen (CN)

(*) Notice: Subject to any disclaimer, the term of this patent is extended or adjusted under 35 U.S.C. 154(b) by 902 days.

(21) Appl. No.: 18/086,739

(22) Filed: Dec. 22, 2022

(65) Prior Publication Data

US 2023/0127099 A1 Apr. 27, 2023

Related U.S. Application Data

(63) Continuation of application No. PCT/CN2021/103509, filed on Jun. 30, 2021.

(30) Foreign Application Priority Data

Jun. 30, 2020 (CN) ......................... 202021264961.0

(51) Int. Cl.
*H02J 7/52* (2026.01)
*G01R 19/165* (2006.01)
(Continued)

(52) U.S. Cl.
CPC .......... *H02J 7/52* (2026.01); *G01R 19/16576* (2013.01); *H01M 10/441* (2013.01);
(Continued)

(58) Field of Classification Search
CPC .... H02J 7/0014; H02J 7/00036; H02J 7/0013; H02J 7/0016; H02J 7/0019;
(Continued)

(56) References Cited

U.S. PATENT DOCUMENTS 4,238,721 A * 12/1980 DeLuca ................ H02J 7/0016 320/122
5,698,967 A * 12/1997 Baer ....................... B60L 53/65 320/152
(Continued)

FOREIGN PATENT DOCUMENTS

CN 206059499 U 3/2017
CN 106712168 A 5/2017
(Continued)

OTHER PUBLICATIONS

International Search Report and Written Opinion for Application No. PCT/CN2021/103509, mailed on Sep. 27, 2021, 12 pages.

*Primary Examiner* — John T Trischler
(74) *Attorney, Agent, or Firm* — Sheppard Mullin Richter & Hampton LLP

(57) ABSTRACT

A charging and discharging system includes multiple battery packs and one or more voltage equalization modules. The multiple battery packs are connected in parallel. Each of a subset of the battery packs is connected in series with a voltage equalization module of the one or more voltage equalization modules. The voltage equalization module is configured to adjust, to a target voltage, an output voltage of the corresponding battery pack and the voltage equalization module that are connected in series.

20 Claims, 8 Drawing Sheets

(51) Int. Cl.

*H01M 10/44* (2006.01)
*H02J 7/44* (2026.01)
*H02J 7/50* (2026.01)
*H02J 7/54* (2026.01)
*H02J 7/56* (2026.01)
*H02J 7/96* (2026.01)
*H01M 10/42* (2006.01)
*H02M 1/00* (2006.01)
*H02M 3/158* (2006.01)
*H02M 3/335* (2006.01)

(52) U.S. Cl.

CPC .................. *H02J 7/44* (2026.01); *H02J 7/50* (2026.01); *H02J 7/54* (2026.01); *H02J 7/56* (2026.01); *H02J 7/96* (2026.01); *G01R 19/16542* (2013.01); *H01M 2010/4271* (2013.01); *H02J 7/575* (2026.01); *H02J 2207/20* (2020.01); *H02M 1/008* (2021.05); *H02M 3/158* (2013.01); *H02M 3/33573* (2021.05); *H02M 3/33584* (2013.01)

(58) Field of Classification Search

CPC .......... H02J 7/007182; H02J 7/52; H02J 7/44; H02J 7/50; H02J 7/54; H02J 7/56; H02J 7/96; G01R 19/16576; H01M 10/441; H02M 3/33573

USPC .......................................................... 320/126

See application file for complete search history.

(56) References Cited

U.S. PATENT DOCUMENTS 6,369,546 B1 * 4/2002 Canter .................. H02J 7/0014 320/118
6,750,631 B2 * 6/2004 Perelle .................. H02J 7/0016 320/112
7,279,867 B2 * 10/2007 Benckenstein, Jr. . H02J 7/0016 320/112
7,471,066 B2 * 12/2008 Ambrosio ............ H02J 7/0014 320/112
8,228,032 B2 * 7/2012 Bai ...................... H02J 7/0016 320/136
8,237,406 B2 * 8/2012 Zheng ................... H02J 7/0016 320/117
8,362,643 B2 * 1/2013 Luo .......................... H02J 3/32 307/46
8,796,992 B2 * 8/2014 Wu ..................... H02J 7/00306 320/117
8,963,501 B2 * 2/2015 Shigemizu .......... H01M 10/441 320/126
9,013,148 B2 * 4/2015 Wu ...................... H02J 7/0018 320/117
9,048,669 B2 * 6/2015 Lim ...................... H02J 7/0019
9,087,806 B2 * 7/2015 Xu ...................... H01M 10/625
9,315,113 B2 * 4/2016 Shrinkle ............... H02J 7/0024
9,343,918 B2 * 5/2016 Yun ......................... H02J 7/342
9,419,449 B2 * 8/2016 Wang .................... H02J 7/0016
9,601,931 B2 * 3/2017 Tabatabaei ............ H02J 7/0019
9,694,707 B2 * 7/2017 Shrinkle ............... H02J 7/0016
9,885,759 B2 * 2/2018 Schipfer .............. G01R 31/364
10,218,190 B2 * 2/2019 Yao ....................... H02J 7/0019
10,243,383 B2 * 3/2019 Nakayama ............ H02J 7/0024
10,381,967 B2 * 8/2019 Lee ..................... H02M 1/4225
10,393,818 B2 * 8/2019 Din ........................ H02J 7/0014
10,615,612 B2 * 4/2020 Yao ...................... H02J 7/00711
10,790,678 B2 * 9/2020 Zheng ................... H02J 7/0014
10,807,487 B2 * 10/2020 Wu ....................... H02J 7/0068
10,826,323 B2 * 11/2020 Hsieh ...................... H02J 9/062
10,847,991 B2 * 11/2020 He ............................ H02J 7/00
11,258,291 B2 * 2/2022 Song ......................... H02J 1/02
11,292,360 B2 * 4/2022 Luo ....................... H02J 7/0014
11,336,192 B2 * 5/2022 Huang .................... B60L 53/22
11,349,334 B2 * 5/2022 Cao ....................... H02J 7/0016
11,476,677 B2 * 10/2022 Liu ................... H01M 10/4257
11,476,681 B2 * 10/2022 Hong .................. H01M 10/425
11,552,479 B2 * 1/2023 Liu ....................... H02J 7/0063
11,557,796 B2 * 1/2023 Hilligoss ............... H02J 7/0019
11,569,668 B2 * 1/2023 Tyagi ...................... H02J 7/005
11,571,981 B2 * 2/2023 Luo ......................... B60L 53/62
11,588,334 B2 * 2/2023 Tenorio ................. H02J 7/0048
11,628,743 B2 * 4/2023 Feng ...................... B60L 58/22 320/134
11,848,580 B2 * 12/2023 Tenorio ................. H02J 7/0047
12,040,635 B2 * 7/2024 Tyagi .................. H02J 7/00714
12,263,757 B2 * 4/2025 Luo ........................... H02J 7/00
12,301,030 B2 * 5/2025 Li ............................. H02J 1/10
2002/0195994 A1 * 12/2002 Perelle .................... B60L 58/22 320/116
2006/0132089 A1 * 6/2006 Ambrosio ............. H02J 7/0014 320/107
2007/0126399 A1 * 6/2007 Benckenstein, Jr. . H02J 7/0016 320/119
2009/0167247 A1 * 7/2009 Bai ...................... H02J 7/0016 320/134
2010/0109607 A1 * 5/2010 Zheng ................... H02J 7/0016 707/E17.108
2010/0276998 A1 * 11/2010 Luo .......................... H02J 3/32 307/46
2011/0089886 A1 * 4/2011 Dubovsky ................. H02J 7/35 320/101
2011/0279085 A1 * 11/2011 Shigemizu ........ H02J 7/007182 320/117
2012/0025754 A1 * 2/2012 Xu ...................... H01M 10/625 320/103
2012/0068540 A1 * 3/2012 Luo .......................... H02J 3/32 307/44
2012/0086390 A1 * 4/2012 Lim ...................... H02J 7/0019 320/134
2012/0187774 A1 * 7/2012 Tabatabaei ............ H02J 7/0019 307/109
2012/0268057 A1 * 10/2012 Wu ....................... H02J 7/0018 320/103
2013/0076310 A1 * 3/2013 Garnier ................. H02J 7/0019 320/118
2014/0062383 A1 * 3/2014 Yun ......................... H02J 7/342 320/103
2014/0176073 A1 * 6/2014 Shrinkle ................. B60L 58/25 320/126
2014/0203780 A1 * 7/2014 Hu ........................ H02J 7/0013 320/112
2014/0292280 A1 * 10/2014 Wang .................... H02J 7/0016 320/134
2014/0300325 A1 * 10/2014 Wu ..................... H02J 7/00302 320/118
2014/0306666 A1 * 10/2014 Choi ..................... H02J 7/0016 320/134
2015/0293179 A1 * 10/2015 Schipfer ........... H01M 10/4285 324/426
2016/0137093 A1 * 5/2016 Shrinkle ................. B60L 58/25 320/126
2017/0160348 A1 * 6/2017 Din ....................... H02J 7/0014
2017/0163060 A1 6/2017 Zheng et al.
2017/0187184 A1 * 6/2017 Nakayama ............ H02J 7/0024
2017/0244258 A1 * 8/2017 Yao ......................... H02J 7/342
2018/0056808 A1 * 3/2018 Gibson ................... B60L 58/22
2018/0191175 A1 * 7/2018 Hsieh .................... H02J 7/0016
2018/0198291 A1 * 7/2018 Kuo ...................... H02J 7/0016
2018/0334046 A1 * 11/2018 Lee ......................... H02M 1/44
2019/0148953 A1 * 5/2019 Yao ....................... H02J 7/0019 320/103
2019/0176636 A1 * 6/2019 Wu ....................... H02J 7/0068
2019/0267827 A1 * 8/2019 He .......................... H02J 7/342
2020/0185954 A1 * 6/2020 Song ......................... H02J 1/02
2020/0254902 A1 * 8/2020 Luo ....................... H02J 7/0016
2020/0307393 A1 * 10/2020 Slepchenkov ............ B60L 1/00
2020/0346552 A1 * 11/2020 Luo ......................... B60L 58/13
2020/0346558 A1 * 11/2020 Luo ......................... B60L 58/12
2020/0389034 A1 * 12/2020 Hong ..................... G01R 31/36
2021/0006078 A1 * 1/2021 Zheng ................... H02J 7/0014

(56) References Cited

U.S. PATENT DOCUMENTS

| | | | | |
|---|---|---|---|---|
| 2021/0016680 | A1* | 1/2021 | Feng | H02J 7/0014 |
| 2021/0028503 | A1* | 1/2021 | Hilligoss | H02M 3/1582 |
| 2021/0036544 | A1* | 2/2021 | Cao | G06F 1/30 |
| 2021/0044210 | A1* | 2/2021 | Huang | B60L 53/22 |
| 2022/0021221 | A1* | 1/2022 | Tyagi | H02M 1/007 |
| 2022/0224129 | A1* | 7/2022 | Liu | H01M 10/425 |
| 2022/0294238 | A1* | 9/2022 | Liu | H02J 7/0063 |
| 2022/0302719 | A1* | 9/2022 | Tenorio | H02J 7/00032 |
| 2022/0320873 | A1* | 10/2022 | Li | H02J 1/10 |
| 2022/0352728 | A1* | 11/2022 | Feng | H01M 10/441 |
| 2023/0010566 | A1* | 1/2023 | Slepchenkov | B60L 1/00 |
| 2023/0049245 | A1* | 2/2023 | Tyagi | H02J 7/00714 |
| 2023/0139157 | A1* | 5/2023 | Tuo | H02J 7/00712<br>320/118 |
| 2023/0155377 | A1* | 5/2023 | Yin | G01R 31/3835<br>429/61 |
| 2023/0170711 | A1* | 6/2023 | Wang | H02J 7/34<br>320/118 |
| 2023/0178997 | A1* | 6/2023 | Tenorio | H02J 7/00036<br>320/112 |
| 2023/0179002 | A1* | 6/2023 | Tyagi | H02J 7/0048 |
| 2023/0356626 | A1* | 11/2023 | Luo | B60L 58/18 |
| 2023/0378770 | A1* | 11/2023 | Ijaz | H02J 7/342 |
| 2024/0136825 | A1* | 4/2024 | Zeng | H02J 7/34 |
| 2024/0235213 | A9* | 7/2024 | Zeng | H02J 7/0014 |
| 2025/0062629 | A1* | 2/2025 | Kwon | H02J 7/56 |
| 2025/0214487 | A1* | 7/2025 | Yan | B60L 15/007 |
| 2025/0279657 | A1* | 9/2025 | Ling | B60L 58/22 |
| 2025/0286387 | A1* | 9/2025 | Zhang | B60L 58/25 |

FOREIGN PATENT DOCUMENTS

| | | | |
|---|---|---|---|
| CN | 106953391 | A | 7/2017 |
| CN | 107666147 | A | 2/2018 |
| CN | 107681733 | A | 2/2018 |
| CN | 108336783 | A | 7/2018 |
| CN | 207939219 | U | 10/2018 |
| CN | 208128137 | U | 11/2018 |
| CN | 208479477 | U | 2/2019 |
| CN | 110239396 | A | 9/2019 |
| CN | 212588110 | U | 2/2021 |
| CN | 213027469 | U | 4/2021 |
| CN | 112993418 | A | 6/2021 |
| CN | 113285129 | A | 8/2021 |
| EP | 1265336 | B1 | 1/2019 |

* cited by examiner

CHARGING AND DISCHARGING SYSTEM

CROSS-REFERENCE TO RELATED APPLICATIONS

This application is a continuation of International Patent Application No. PCT/CN2021/103509 filed with the China National Intellectual Property Administration (CNIPA) on Jun. 30, 2021, which is based on and claims priority to and benefits of Chinese Patent Application No. 202021264961.0, filed on Jun. 30, 2020. The entire content of all of the above-referenced applications is incorporated herein by reference.

FIELD

The present disclosure relates to the technical field of batteries, and more specifically, to a charging and discharging system.

BACKGROUND

With the rapid development of the lithium battery and the lithium battery energy storage technology, more lithium battery energy storage applications are increasingly in demand. Lithium battery packs are generally realized by battery cores connected in series and parallel. The lithium battery packs used in an energy storage system are generally realized by series or parallel connection of lithium battery packs in order to obtain a larger capacity.

SUMMARY

The present disclosure is intended to resolve at least one of technical problems existing in the related art. An objective of the present disclosure is to provide a charging and discharging system, which can realize safe parallel connection of battery packs and can effectively resolve the problem regarding circulating currents of batteries connected in parallel, and has low costs and a small volume and weight.

In order to achieve the above objectives, according to an embodiment of the present disclosure, a charging and discharging system is provided. The charging and discharging system includes: multiple battery packs connected in parallel; and at least one voltage equalization module, where each of a subset of the battery packs is connected in series with the at least one voltage equalization module. The at least one voltage equalization module is configured to adjust, to a target voltage, an output voltage of the corresponding battery pack and the at least one voltage equalization module that are connected in series.

In some embodiments, the voltage equalization module is a boost-buck equalization module. The boost-buck equalization module is connected in series with the battery pack, and is configured to increase or decrease, to the target voltage, an output voltage of the battery pack and the boost-buck equalization module that are connected in series.

In some embodiments, the boost-buck equalization module includes a boost-buck regulation unit. The boost-buck regulation unit further includes:

a first converter, configured to convert a direct current (DC) supply signal to an alternating current (AC) signal;

a transformer, including a primary side coil and a secondary side coil, where the primary side coil of the transformer is connected with an output terminal of the first converter, and is configured to transmit the AC signal;

a second converter, where an input terminal of the second converter is connected with the secondary side coil of the transformer, and is configured to convert the AC signal to a first DC signal, and a voltage value of the first DC signal is equal to an absolute value of a voltage difference between the target voltage and the output voltage of the battery pack; and a third converter, where an input terminal of the third converter is connected with an output terminal of the second converter, the third converter is configured to convert the first DC signal to a second DC signal, an output terminal of the third converter outputs the second DC signal, and a voltage value of the second DC signal is equal to a voltage value of the first DC signal, or the voltage value of the second DC signal is a negative value of the voltage value of the first DC signal.

In some embodiments, the voltage equalization module is a boost equalization module. The boost equalization module is connected in series with the battery pack, and is configured to increase, to the target voltage, an output voltage of the battery pack and the boost equalization module that are connected in series.

In some embodiments, the voltage equalization module is a buck equalization module. The buck equalization module is connected in series with the battery pack, and is configured to decrease, to the target voltage, an output voltage of the battery pack and the buck equalization module that are connected in series.

In some embodiments, the charging and discharging system further includes at least one external power supply module. The at least one external power supply module is connected with the at least one voltage equalization module, and is configured to provide a DC supply signal for the voltage equalization module.

In some embodiments, the battery pack is connected in parallel to a busbar.

In some embodiments, N battery packs are arranged, and N voltage equalization modules are arranged. The N battery packs are connected in series with the N voltage equalization modules in a one-to-one correspondence, so that the output voltage of each of the battery packs and each of the voltage equalization modules that are connected in series is equal to the target voltage. The target voltage is a busbar voltage.

In some embodiments, N battery packs are arranged, and N−1 voltage equalization modules are arranged. The N−1 battery packs are connected in series with the N−1 voltage equalization modules in a one-to-one correspondence, so that the output voltage of each of the battery packs and a corresponding one of the voltage equalization modules that are connected in series is equal to the target voltage. The target voltage is equal to the output voltage of the battery pack that is not connected in series with the voltage equalization module.

In some embodiments, the voltage equalization module includes: a voltage regulation unit, being a boost-buck regulation unit, a boost regulation unit, or a buck regulation unit; a communication unit, connected with battery management units of the multiple battery packs, and configured to acquire battery parameters of each of the battery packs; a current detection unit, configured to detect an output current of the voltage equalization unit; a voltage detection unit, configured to detect an output voltage of the voltage equalization unit; and a control unit, connected with the communication unit, the current detection unit, and the voltage detection unit, and configured to control the voltage regulation unit according to the battery parameters, the output current, and the output voltage, so that the output voltage of the battery pack and the voltage equalization module that are connected in series is equal to the target voltage.

In some embodiments, the charging and discharging system further includes multiple switch modules. The switch modules are connected in series with the voltage equalization modules in a one-to-one correspondence.

In another aspect, the present disclosure provides an energy storage system. The energy storage system includes the charging and discharging system according to the above embodiments.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible in the embodiment description made with reference to the following accompanying drawings, where.

REFERENCE NUMERALS

Related Art

Figure 1:
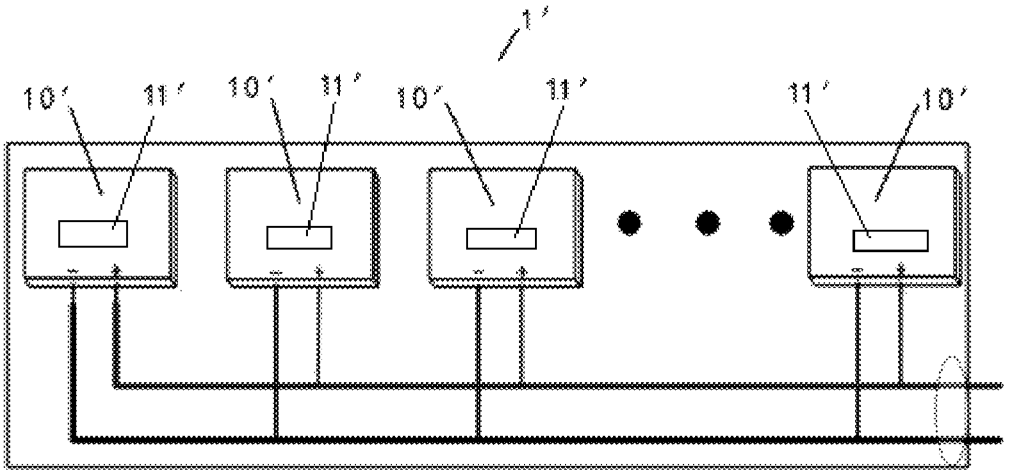
FIG. 1 (related art)
FIG. 1 is a schematic structural diagram of an energy storage system in the related art.

Energy storage system 1', battery pack 10', battery core 11', DC/DC converter 20',

The Present Disclosure

Charging and discharging system 1,
busbar 10, positive busbar 11, negative busbar 12,
battery pack 20, battery management system 21, voltage equalization module 30, switch 40, external power supply module 311,
communication unit 36, voltage acquisition module 37, current acquisition module 38, and control unit 39.

DETAILED DESCRIPTION

The embodiments of the present disclosure are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary, and are intended to explain the present disclosure and cannot be construed as a limitation to the present disclosure.

In the description of the present disclosure, “multiple” means two or more than two.

The present disclosure is provided by the author of the present disclosure based on the discovery and recognition of the following facts and problems.

In the related art, as the energy storage system is used in extended operating time, the characteristics of the battery packs connected in parallel gradually vary with each other. Adding or replacing battery packs will cause internal circulating currents due to voltage differences of the battery packs. This causes the effective capacity of the energy storage system to reduce, and the battery of the energy storage system to be unbalanced. The performance of the energy storage system is degraded.

In the related art, the direct parallel connection of lithium battery packs is generally realized by increasing the current protection value. However, the above method has the following disadvantages. First, it is necessary to ensure that the voltage difference of the lithium battery packs to be connected in parallel is as small as possible. If the voltage difference is too large, an inrush current during parallel connection may be greater than a set overcurrent protection value, resulting in the failure of parallel connection. Second, a large circulating current still exists between the lithium battery packs connected in parallel, and the risk of damaging the lithium battery packs is very high. Third, if there are a large number of battery cores in the lithium battery packs, the wiring is inconsistent, the battery impedance is inconsistent, and the battery consistency is poor, which may also generate a large circulating current that will damage the battery.

In the related art, the direct parallel connection of lithium battery packs is also realized by connecting equalization modules in parallel. However, the power of the equalization module is excessively high due to the direct parallel connection of the equalization modules. Therefore, in order to meet the requirement of directly connecting the lithium battery packs in parallel, a high-power equalization module is selected, which may lead to high costs of the entire energy storage system and increased volume and weight of the energy storage system, and therefore is inconvenient to use.

In the related art, in order to realize the parallel connection of battery packs, for example, the solution 1 shown in FIG. 1, the direct parallel connection is realized by increasing the current protection value. When battery packs 10' are connected in parallel, two battery packs 10' are used as an example. The generated inrush current $$Ipk = \frac{Vpack1 - Vpack2}{N1*(R1+R2)+N2*(R1+R2)}.$$

Vpack1 and Vpack2 are respectively voltages of the two battery packs 10', and N1 and N2 are respectively quantities of battery cores 11' inside the battery packs 10'. A battery core parasitic resistance R1 and a welding resistance R2 are generally controlled to be relatively small. Therefore, if a voltage difference between the two battery packs 10' is not too large, the peak current during parallel connection can be controlled within a certain range, and direct parallel connection can be performed as long as overcurrent protection of a battery management system (BMS) of the battery packs 10' is not triggered.

For example, the battery packs 10' are composed of 16 battery cores 11' connected in series. Due to the use and the initial states of the battery packs 10', it is assumed that a voltage of a battery pack 10' is 54 V, and a voltage of another battery pack 10' is 48 V. By laser welding, the internal resistance of the battery core 11' is 1 m'Ω, the welding resistance is 1 m'Ω, and then through calculation, a peak current in parallel connection $$Ipk = \frac{54\ \text{V} - 48\ \text{V}}{16*(1+1)*10^{-3}+16*(1+1)*10^{-3}} = 93.75A.$$

Therefore, the peak protection current is set to be greater than 93.75 A, so as to realize direct parallel connection without triggering overcurrent protection, and achieve success in the parallel connection. When the parallel connection succeeds, the self-equilibrium of the battery pack 10' is realized through self-discharge.

Figure 2:
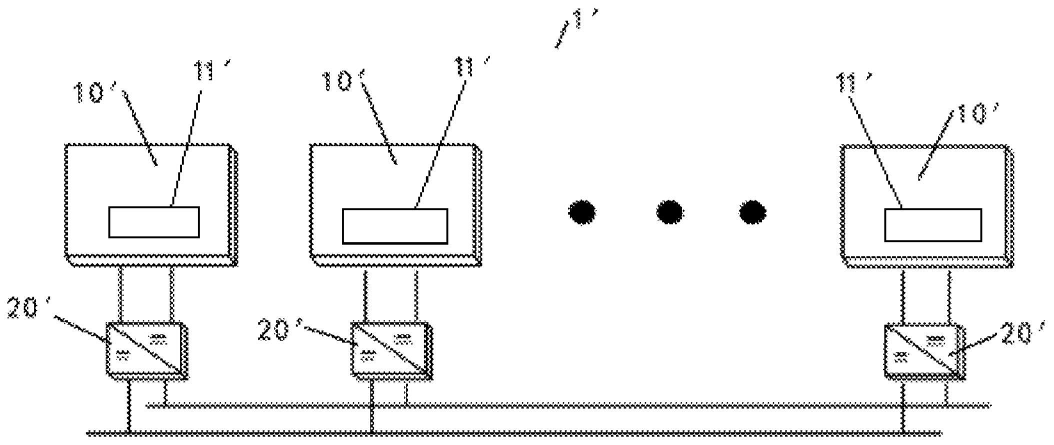
FIG. 2 (related art)
FIG. 2 is a schematic diagram of a solution of an energy storage system that has the problem of high power of a DC/DC module in the related art.

For the disadvantages existing in the above solution 1, in order to resolve the problem of safe parallel connection, a solution 2 shown in FIG. 2 is provided in the related art, in which a bidirectional DC/DC converter 20' is added to an output terminal of each battery pack 10'. However, the solution 2 has disadvantages of high costs, a large volume and high power of the DC/DC converter, which is inconvenient to use.

In consideration of the situation in the related art, the present disclosure provides a charging and discharging system, which can resolve the problems of safe parallel connection and circulating currents of batteries.

Beneficial effects of the present disclosure are described as follows. According to the charging and discharging system of the embodiments of the present disclosure, at least one voltage equalization module is arranged. Each of a subset of the battery packs is connected in series with a voltage equalization module. The at least one voltage equalization module is configured to adjust, to the target voltage, the output voltage of the corresponding battery pack and the at least one voltage equalization module that are connected in series, that is, the output voltage of the battery pack and the voltage equalization module that are connected in series is equal to the target voltage. In this way, the voltage difference between the battery packs can be reduced, the inrush current during the parallel connection can be reduced, safe parallel connection is realized, and the voltage difference between the battery packs is relatively small, so as to avoid the formation of circulating currents between the battery packs connected in parallel. The solution effectively resolves the problem regarding circulating currents of batteries connected in parallel, improves the reliability and stability of the system, and increases the life of the system. In addition, compared with the solutions of the existing parallel equalization module, since the voltage equalization module and the battery pack in the embodiment of the present disclosure are connected in series, the output voltage of the equalization module is the difference between the target voltage and the output voltage of the battery pack, and the difference is very small compared with an output voltage of a branch where the battery pack is located. Therefore, the present disclosure can further reduce the power of the voltage equalization module, thereby reducing the cost and the volume and weight of the energy storage system, which facilitates mass application and mounting.

A charging and discharging system according to an embodiment of the present disclosure is described below with reference to the accompanying drawings.

Figure 3:
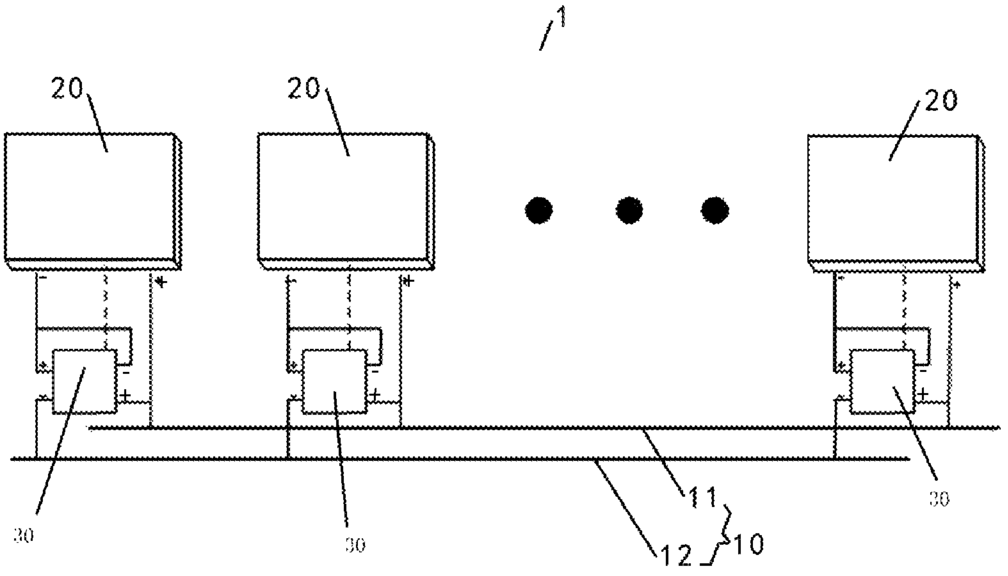
FIG. 3 is a schematic structural diagram of an embodiment of a charging and discharging system according to the present disclosure.

As shown in FIG. 3, the charging and discharging system 1 according to the embodiment of the present disclosure includes multiple battery packs 20 and at least one voltage equalization module 30.

The multiple battery packs 20 are connected in parallel. Each of the battery packs 20 includes multiple battery cores. The multiple battery cores are connected in series or in parallel to form a battery pack. The battery cores may be lithium batteries, or the like.

Each of a subset of the battery packs 20 is connected in series with the at least one voltage equalization module 30. In an embodiment, the subset of the battery packs may include all of the multiple battery packs 20 or may be part of the multiple battery packs 20. In the embodiment, each of the subset of the battery packs 20 may be connected in series with one voltage equalization module, or each of the subset of the battery packs 20 may be connected in series with multiple voltage equalization modules. Further, each of the subset of the battery packs may be connected in series with a boost-buck module or a boost module or a buck module. In some embodiments, after the battery pack is connected with a boost module in series, the boost module is connected in series with the buck module, and the buck module is connected to a busbar. In some embodiments, after the battery pack is connected with a buck module in series, the buck module is connected in series with the boost module, and then the boost module is connected to a busbar.

In an embodiment, the at least one voltage equalization module 30 is configured to adjust, to a target voltage, an output voltage of the corresponding battery pack and the at least one voltage equalization module 30 that are connected in series. That is to say, the output voltages of the battery packs 20 and the voltage equalization modules 30 that are connected in series are equal to the target voltage. Thus, the voltage of the voltage equalization module 30 is a voltage difference between the target voltage and a voltage of the battery pack. In the embodiment, the target voltage may be a preset busbar voltage, and the busbar voltage is a voltage value within a busbar voltage error range. The busbar voltage error range is based on the busbar voltage. The busbar voltage error range means that in the practical application, subject to the impact of the adjustment accuracy, the target voltage can only be infinitely close to the busbar voltage and cannot be absolutely equal to the busbar voltage value. For example, in this embodiment, a value of the preset busbar voltage is 600 V, and the target voltage can be within the range of 600 V±1 V. In some embodiments, the target voltage may also be within the range of the output voltages of the battery packs that are not connected in series with the voltage equalization modules 30, so that the output voltages of the multiple battery packs 20 connected in parallel can be closer to each other. The voltage difference between the battery packs 20 connected in parallel can be reduced, and an inrush current during the parallel connection is reduced, so as to avoid the formation of circulating currents between the battery packs 20 connected in parallel, thereby realizing the safe parallel connection.

According to the charging and discharging system 1 of the embodiment of the present disclosure, the voltage equalization module 30 is arranged for the battery packs. That is to say, each of the subset of the battery packs is connected in series with at least one voltage equalization module. The at least one voltage equalization module 30 is configured to adjust, to the target voltage, the output voltage of the corresponding battery pack and the at least one voltage equalization module 30 that are connected in series, that is, the output voltage of the battery pack and the voltage equalization module that are connected in series is equal to the target voltage. In this way, the voltage difference between the battery packs can be reduced, the inrush current during the parallel connection can be reduced, safe parallel connection is realized. The voltage difference between the battery packs is relatively small, so as to avoid the formation of circulating currents between the battery packs connected in parallel, thereby effectively resolving the problem regarding circulating currents of batteries connected in parallel. This improves the reliability and stability of the system, and increases the life of the system. In addition, compared with the solution of the existing bidirectional DC/DC converter, since the voltage equalization module 30 and the battery pack 20 in the embodiment of the present disclosure are connected in series, the output voltage of the equalization module 30 is the difference between the target voltage and the voltage of the battery pack 20, and the difference is very small compared with an output voltage of a branch where the battery pack 20 is located. Therefore, the solution of the present disclosure can further reduce the power of the voltage equalization module 30. In one embodiment, compared with the solution 2 in the related art, the charging and discharging system 1 of the embodiment of the present disclosure can reduce the power of the voltage equalization module from original 150 KW of the DC/DC module to 1.25 KW. That is, the power is reduced to 0.8% of the original power. Therefore, the voltage equalization module 30 of the embodiment of the present disclosure can have a smaller volume and lower costs, so as to facilitate mass application and mounting.

Figure 4:
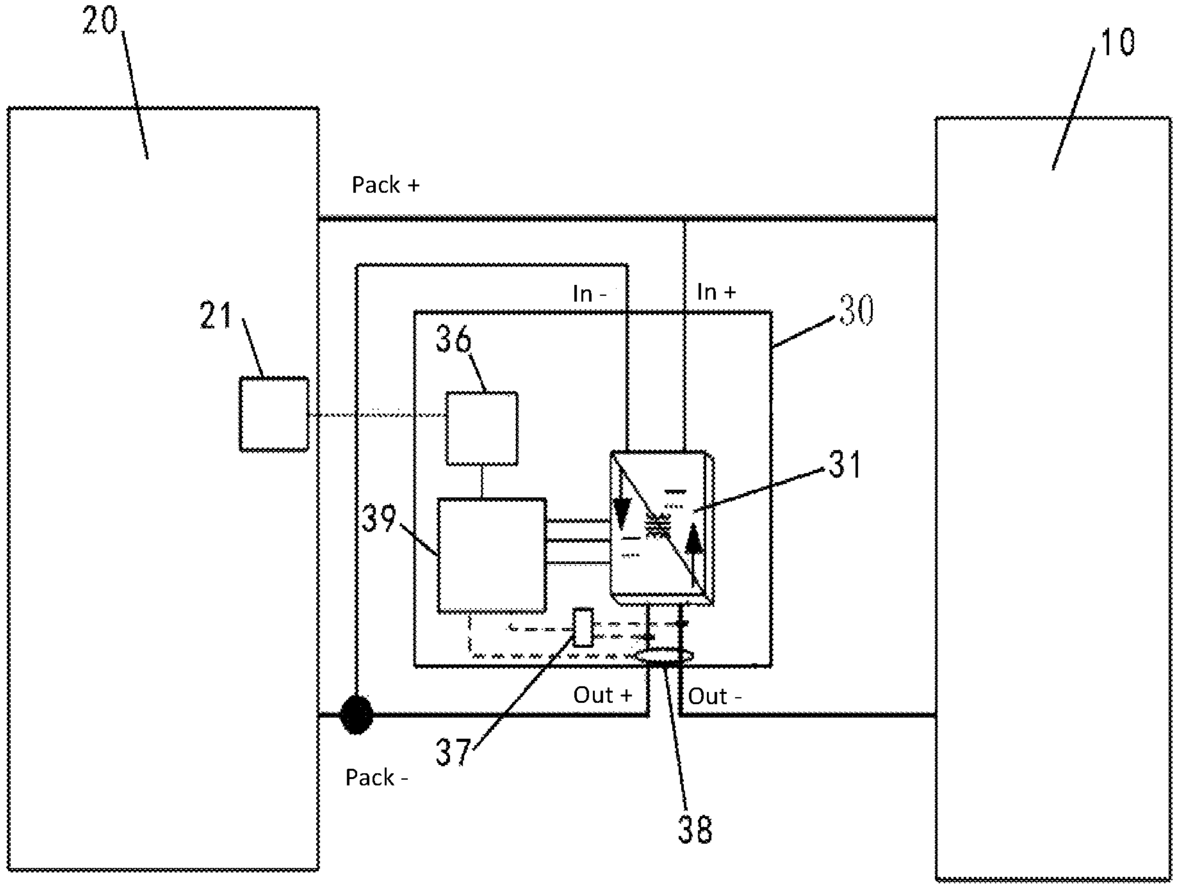
FIG. 4 is a schematic structural diagram of a battery pack connected with a voltage equalization module according to an embodiment of a charging and discharging system of the present disclosure.

In the embodiment, the voltage equalization module 30 may be connected in series with a positive electrode of a main circuit, or may be connected in series with a negative electrode of the main circuit. FIG. 4 is a schematic diagram of the voltage equalization module 30 connected in series with the negative electrode of the battery pack. A positive input terminal of the voltage equalization module is connected with the positive electrode of the battery pack 20, and a negative input terminal of the voltage equalization module is connected with a negative electrode of the battery pack 20. A positive output terminal of the voltage equalization module is connected in series with the negative electrode of the battery pack 20, and a negative output terminal of the voltage equalization module is an external negative electrode of the battery system.

In some embodiments, the voltage equalization module 30 may be a boost-buck equalization module. The boost-buck equalization module is connected in series with the battery pack 20, and is configured to increase or decrease, to the target voltage, an output voltage of the battery pack 20 and the boost-buck equalization module that are connected in series. The above boost-buck equalization module may be unidirectionally adjusted for the output voltage of the battery pack branch. In other words, the output voltage of the battery pack branch where the boost-buck equalization module is located may be increased or decreased by the boost-buck equalization module, so that the output voltages of all of the battery pack branches connected in parallel achieve equalization, and the voltage difference is reduced to avoid the formation of a circulating current between the branches of the battery packs 20, so as to achieve the equalization. The target voltage may be the busbar voltage within the busbar voltage range or within the busbar voltage error range or the output voltage of the battery pack that is not connected with the voltage equalization module 30. The busbar voltage within the busbar voltage range may be equal to the busbar voltage value at the current moment and within the busbar voltage error range.

In some embodiments, the voltage equalization module 30 may be a boost equalization module. The boost equalization module is connected in series with the battery pack, and is configured to increase, to the target voltage, an output voltage of the battery pack and the boost equalization module that are connected in series. The boost equalization module includes a boost regulation unit. In some embodiments, the voltage equalization module 30 may be a buck equalization module. The buck equalization module is connected in series with the battery pack, and is configured to decrease, to the target voltage, an output voltage of the battery pack and the buck equalization module that are connected in series. The buck equalization module includes a buck regulation unit.

For example, for the parallel connection of battery packs 20 composed of old and new battery packs connected in parallel, the output voltages of some battery packs 20 are relatively low, while the output voltages of some battery packs 20 are relatively high. In order to meet the equalization requirements, the buck equalization module or the boost equalization module may be selected in a targeted manner to be connected with the corresponding battery pack 20 in series to achieve the purpose of voltage equalization, so that the output voltage value after the series connection can be close to the target voltage.

In some embodiments, the boost-buck equalization module, or the boost equalization module, or the buck equalization module may be selected for series connection according to the situations of the battery packs connected in parallel, or a combination of the boost module or the buck module is selected to be connected in series with the battery pack, so as to achieve the equalization of the output voltage of the branch where the battery packs connected in parallel are located, thereby avoiding the formation of the circulating current.

Figure 5:
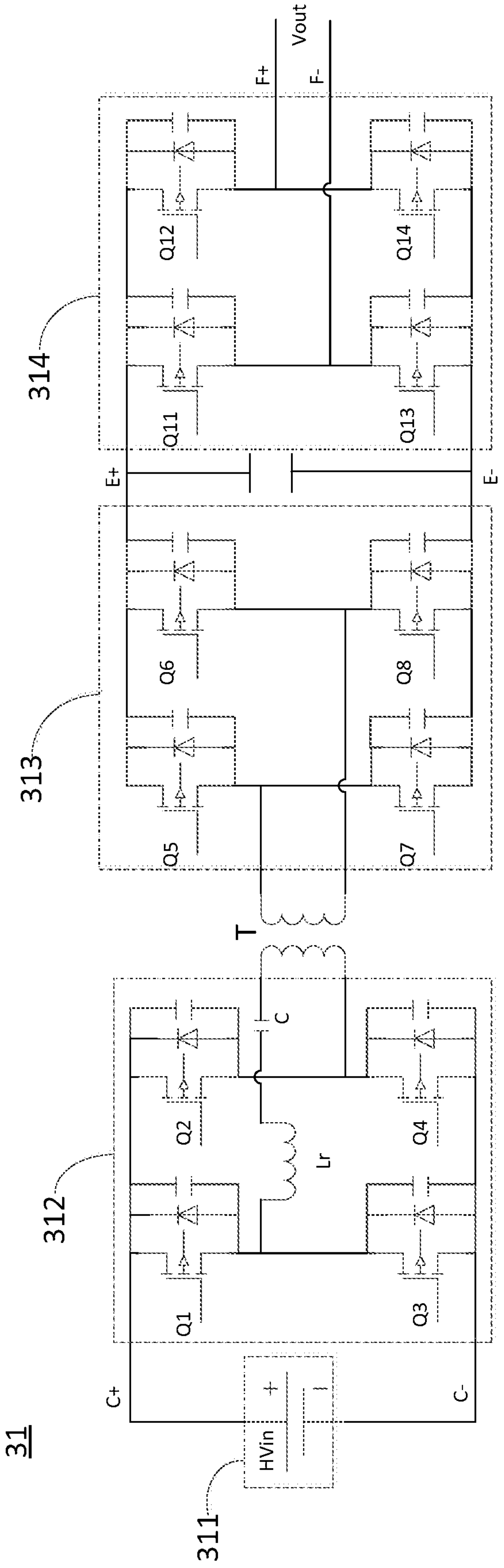
FIG. 5 is a circuit diagram of a bidirectional DC/DC power converter according to an embodiment of a charging and discharging system of the present disclosure.

Further, in the embodiment, as shown in FIG. 4, the boost-buck equalization module includes a boost-buck regulation unit 31. As shown in FIG. 5, the boost-buck regulation unit 31 further includes a first converter 312, a transformer T, a second converter 313, and a third converter 314.

The first converter 312 is configured to convert a direct current (DC) supply signal to an alternating current (AC) signal. The transformer T includes a primary side coil and a secondary side coil. The primary side coil of the transformer T is connected with an output terminal of the first converter 312, and is configured to transmit the AC signal. An input terminal of the second converter 313 is connected with the secondary side coil of the transformer T, and is configured to convert the AC signal to a first DC signal. A voltage value of the first DC signal is equal to an absolute value of a voltage difference between the target voltage and the output voltage of the battery pack. An input terminal of the third converter 314 is connected with an output terminal of the second converter 313. The third converter 314 is configured to convert the first DC signal to a second DC signal. An output terminal of the third converter 314 outputs the second DC signal. A voltage value of the second DC signal is equal to a voltage value of the first DC signal, so as to achieve boosting, or the voltage value of the second DC signal is a negative value of the voltage value of the first DC signal, so as to achieve voltage reduction.

In some embodiments, the first converter 312, the transformer T, and the second converter 313 can take the form of a bidirectional DC/DC power converter and may be combined with the third converter 314 to realize boost and buck. The bidirectional DC/DC power converter is equally applicable to charging and discharging of the power supply. Different from the common bidirectional DC/DC power converter, the boost-buck equalization module of the embodiment of the present disclosure can realize boosting and bucking of a unidirectional input by adding the third converter 314.

In the embodiment, the bidirectional DC/DC power converter can be implemented by using various topology schemes. FIG. 5 shows a circuit diagram of a DC/DC topology scheme, that is, a phase-shifted full-bridge DC/DC converter topology. This topology is just an example to illustrate the completeness of the entire system solution, and therefore should not be construed as a limitation on the scope of the patent of the present disclosure, and other DC/DC topologies also fall within the protection scope of the present disclosure.

The boost-buck equalization module shown in FIG. 5 is used as an example. The composition and connection of the first converter 312, the second converter 313, and the third converter 314 are shown in the figure. The modulation principle of the first converter 312 and the second converter 313 is that Q1 and Q3 are controlled to be closed complementarily, Q2 and Q4 are controlled to be closed complementarily, and they have a duty cycle of 50%. A modulation signal for a low-voltage side switch transistor of the transformer T and a modulation signal for a high-voltage side switch transistor have a same sequence (Q5 and Q7 are closed complementarily, Q7 and Q8 are closed complementarily, and they have a duty cycle of 50%), but differ from each other by an angle. By changing the angle difference of the modulation signals on the high and low voltage sides, the output voltage regulation function and the battery charging or battery discharging function are realized. The bidirectional DC/DC power converter can adjust the current direction through the on/off of the switch transistor of the third converter 314 in the second half to output a positive voltage or a negative voltage. Transforming and controlling the output voltage of the bidirectional DC/DC power converter can directly output the output voltage of the bidirectional DC/DC power converter (specified as a positive voltage) or convert the bidirectional DC/DC power converter to a negative voltage for output.

As shown in FIG. 5, the input terminal of the third converter 314 is connected with the output of the second converter 313, the first output terminal of the third converter 314 is connected with the battery pack, and the second output terminal of the third converter 314 is connected with the busbar. The third converter 314 includes switch transistors Q11, Q12, Q13, and Q14. It is assumed that E+ is a positive electrode of an input power supply, E− is a negative electrode of the input power supply, F+ is a positive electrode of an output power supply, and F− is a negative electrode of the output power supply. When the output voltage of the third converter 314 is required to be a positive voltage, Q12 and Q13 are controlled to be closed simultaneously, then F+ and E+ have the same potential, and F− and E− have the same potential, that is, the output voltage is the same as the input voltage, which is a positive voltage, so as to realize the function of boosting. When the output voltage of the third converter 314 is required to be a negative voltage, Q11 and Q14 are controlled to be closed simultaneously, then F+ and E− have the same potential, and F− and E+ have the same potential, that is, the output voltage is the opposite to the input voltage, which is a negative voltage, so as to realize the function of bucking.

In some embodiments, as shown in FIG. 4, the voltage equalization module 30 includes a voltage regulation unit 31, a communication unit 36, a current detection unit 38, a voltage detection unit 37, and a control unit 39.

The voltage regulation unit 31 may have a unidirectional function, for example, a function of achieving bucking alone or boosting alone. That is to say, boosting or bucking can only be performed in one way. For example, the topology of the boost regulation unit or the buck regulation unit may adopt a general bidirectional DC/DC module. In some embodiments, the voltage regulation unit 31 may also realize both boosting and bucking in the same direction, for example, the boost-buck voltage regulation unit above. That is to say, the voltage regulation unit 31 may be a boost-buck regulation unit, a boost regulation unit, or a buck regulation unit. The communication unit 36 is connected with battery management units of the multiple battery packs 20, and configured to acquire battery parameters of each of the battery packs. The current detection unit 38 is configured to detect an output current of the voltage regulation unit 31. The voltage detection unit 37 is configured to detect an output voltage of the voltage regulation unit. The control unit 39 is respectively connected with the communication unit 36, the current detection unit 38, and the voltage detection unit 37, and configured to control the voltage regulation unit 31 according to the battery parameters, the output current, and the output voltage, so that the output voltage of each of the battery packs 20 and the voltage equalization module 30 that are connected in series is equal to the target voltage. For example, the control unit 39 may be a device such as a control chip, a DSP, a single-chip microcomputer, or the like. The control unit 39 communicates with the battery management unit 21 of the battery pack 20 through the communication module 36. For example, the communication may be realized by RS485, RS232, CAN, and the like. The information obtained from the battery pack 20 includes, for example, a voltage, a current, a temperature, a capacity, and alarm information of the battery pack. The operation of the voltage regulation unit 31 is controlled according to these parameters of the battery packs 20, for example, voltage regulation coefficients of the voltage regulation unit, to achieve the boosting or bucking. In some embodiments, when alarm information is detected, the voltage regulation unit 31 is turned off, or the like. The voltage regulation unit 31 is monitored to output a current and a voltage, so as to form closed-loop control more accurately, so that the output voltage of the battery pack 20 and the voltage equalization module 30 that are connected in series is close to the target voltage, thereby achieving the purpose of equalization. The voltage difference between the battery packs connected in parallel is reduced, so as to avoid the formation of the circulating current.

In some embodiments, as shown in FIG. 3, the battery pack is connected in parallel to a busbar 10. The busbar includes a positive busbar 11 and a negative busbar 12.

In some embodiments, N battery packs 20 are arranged. The N battery packs 20 are connected in parallel with the busbar 10. N voltage equalization modules 30 are arranged. The number of the battery packs is equal to the number of the N voltage equalization modules 30. The N battery packs 20 are connected in series with the N voltage equalization modules 30 in a one-to-one correspondence, so that the output voltage of each of the battery packs 20 and each of the voltage equalization modules 30 that are connected in series is equal to the target voltage. The target voltage is a busbar voltage. Therefore, the output voltage of each battery pack branch is near the busbar voltage, that is, within the busbar voltage error range, so as to achieve the purpose of equalization. The voltage difference between parallel branches is reduced, so as to avoid the formation of the circulating current between battery packs connected in parallel.

Figure 6:
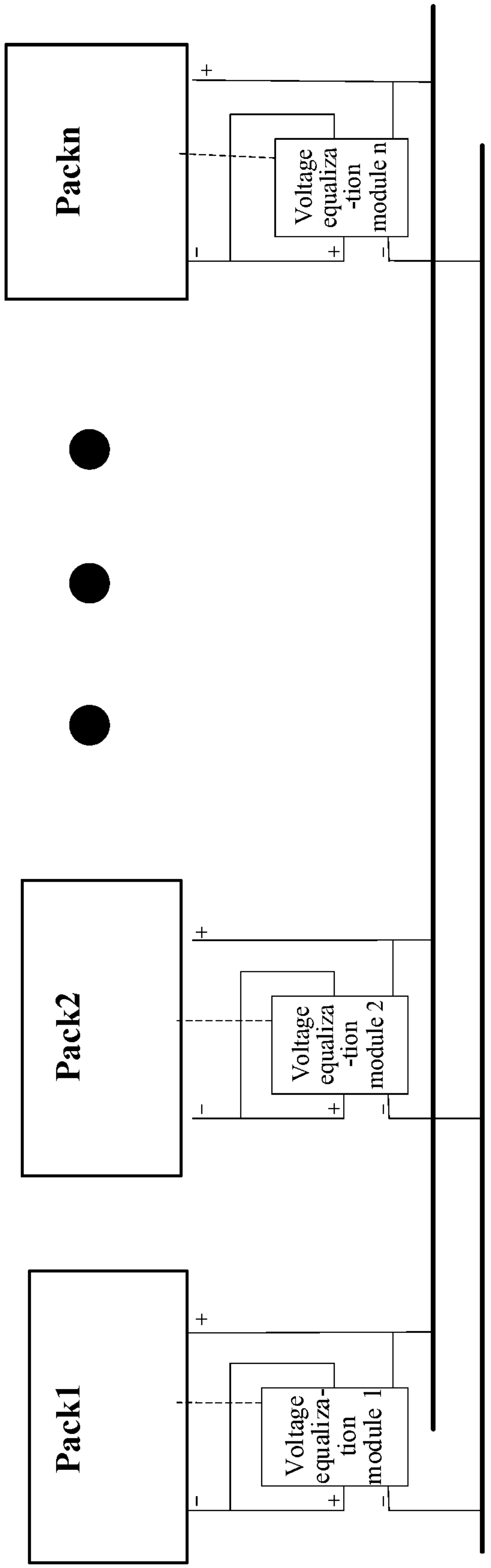
FIG. 6 is a schematic diagram of a charging and discharging system according to an embodiment of the present disclosure.

For example, as shown in FIG. 6, the system includes several battery packs Pack1, Pack2, . . . , and Packn, and a voltage equalization module 1, . . . , and a voltage equalization module n. Each of the battery packs is connected in series with the voltage equalization module 30 and then connected in parallel to the DC busbar. The values of the voltages outputted by the battery packs 20 and the corresponding voltage equalization modules 30 that are connected in series are within an allowable voltage range of the busbar voltage, so as to reduce the voltage difference between the battery packs 20 connected in parallel and eliminate the parallel circulating currents.

Figure 7:
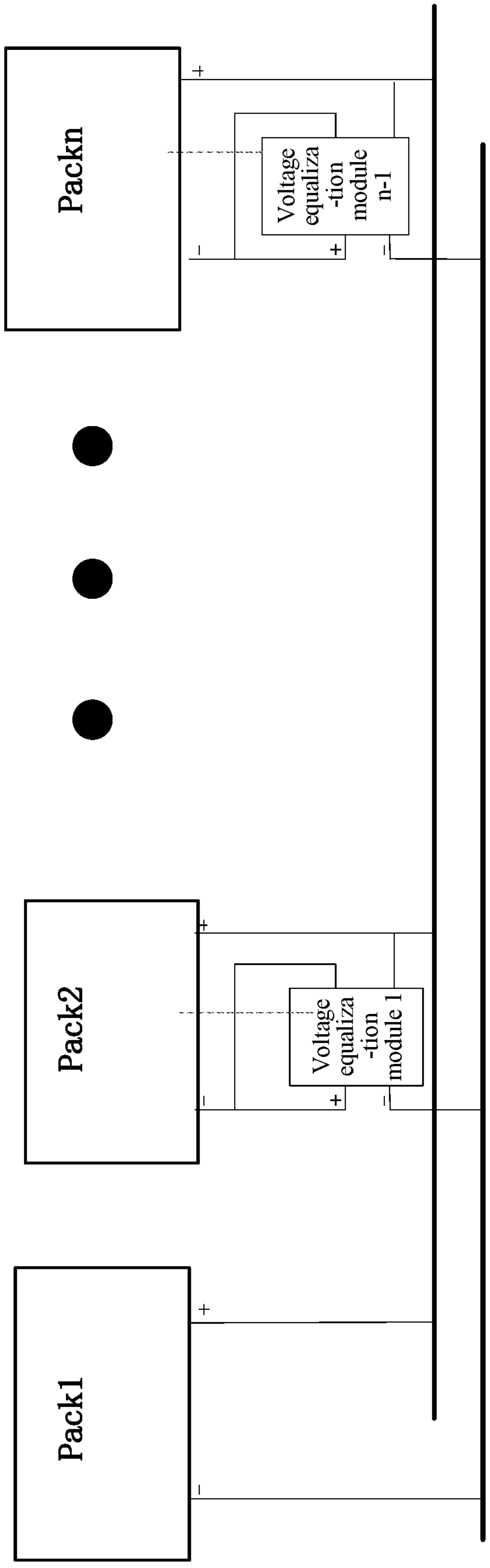
FIG. 7 is a schematic diagram according to an embodiment of the present disclosure.

In some embodiments, as shown in FIG. 7, N battery packs are arranged. The N battery packs are connected in parallel with the busbar. N−1 voltage equalization modules are arranged. The N−1 battery packs are connected in series with the N−1 voltage equalization modules in a one-to-one correspondence, so that the output voltage of each of the battery packs and a corresponding one of the voltage equalization modules that are connected in series is equal to the target voltage. The target voltage is equal to an output voltage of the battery pack that is not connected in series with the voltage equalization module. That is to say, the values of the voltages outputted by the battery packs 20 and the corresponding voltage equalization modules 30 that are connected in series are within the range of the output voltages of the battery packs 20 that are not connected with the voltage equalization modules 30, so as to achieve equalization of the voltage between the battery packs 20 connected in parallel. The voltage difference between the battery packs 20 is reduced, so as to eliminate the parallel circulating currents. The above target voltage may also be the busbar voltage, so that the output voltage of each battery pack branch is near the busbar voltage, that is, within the busbar voltage error range, so as to achieve the purpose of equalization. The voltage difference between parallel branches is reduced, so as to avoid the formation of the circulating current between battery packs connected in parallel. A topology of FIG. 6 differs from a topology of FIG. 7 in that the former has one less voltage equalization module than the latter. N battery packs only need N−1 voltage equalization modules to achieve the same function, which is more cost-effective.

Two battery packs are used as an example below. Each of the battery packs is connected in series with a voltage equalization module. For example, voltages of the batteries PACK1 and PACK2 are V1=590 V and V2=610 V respectively, the battery busbar voltage may be set to 600 V, and the output current is set to 250 A. In order to be consistent with the busbar voltage, the output voltage of the voltage equalization module 30 and the battery PACK1 that are connected in series should be +10 V. For example, DC/DC power conversion is performed through the first converter 312 and the second converter 313, the voltage of the power supply module is converted to 10 V, then Q12 and Q13 are controlled to be closed simultaneously, and the third converter 314 directly outputs 10 V. In this case, the voltage V1 of the battery PACK1 plus the output voltage 10 V of the voltage equalization module 30 is equal to the busbar voltage 600 V, and the output power of the voltage equalization module 30 is P1=10 V*250 A=2500 W. In order to be consistent with the busbar voltage, the voltage equalization module 30 connected in series with PACK2 outputs −10 V. For example, the voltage of the power supply module is converted to 10 V through the first converter 312 and the second converter 313, then Q11 and Q14 are controlled to be closed simultaneously, and the third converter 314 outputs −10 V. In this case, the output voltage of the voltage V2 of the battery PACK2 and the voltage equalization module 30 that are connected in series is equal to the busbar voltage, and the output power of the voltage equalization module 30 is P2=10 V*250 A=2500 W. In order to realize reliable parallel connection of two battery packs, the control unit of each voltage equalization module 30, such as an MCU, communicates with the BMS of the battery pack through the communication module 36. The voltage information of the battery pack is collected, such as V1=598 V and V2=595 V, and an output voltage of 600 V and a current of 100 A are collected through the voltage detection unit 37 and the current detection unit 38. According to the information, the output voltage information and current information are transmitted to the control unit MCU, and the voltage equalization module is controlled to operate, so that each battery pack outputs the same current. Voltage adjustment coefficients of the voltage equalization modules of the battery Pack1 and the battery Pack2 are adjusted to k1 and k2, so that the output voltage of each battery pack can be raised to Vbus.

If the above external conditions remain unchanged, the voltages of the batteries PACK1 and PACK2 are respectively Va1=590 V and Va2=610 V. If the common bidirectional DC/DC module in the related art is used in the solution, the busbar voltage is required to be set to above 610 V (for example, set to 612 V), and the current of 250 A remains unchanged. For PACK1, the bidirectional DC/DC module outputs +22 V (the voltage of the battery pack is converted to 22 V output voltage through the DC/DC module, the voltage of the battery PACK1 plus the voltage of the bidirectional DC/DC module is equal to the set busbar voltage, and the DC/The output power of DC control module 1 is P1=22 V*250 A=5500 W). For PACK2, the bidirectional DC/DC module outputs +2 V (the voltage of the battery pack is converted to 2 V output voltage through the DCDC module, the voltage of the battery PACK2 is equal to the set busbar voltage, and the output power of the DC/DC power converter P2=2 V*250 A=500 W). It can be clearly found that for PACK1, the output power of the conventional DC/DC module is nearly twice the output power of the voltage equalization module 30 in the embodiment of the present disclosure. Compared with the system using the voltage equalization module 30 according to the embodiment of the present disclosure, the system using the conventional bidirectional DC/DC module will obviously have a larger product volume, greater loss, and higher costs.

Therefore, in the embodiment of the present disclosure, the equalization and protection between the battery packs 20 in parallel can be effectively and quickly realized by arranging the voltage equalization modules 30 connected in series, which may also be realized for new batteries and retired batteries independent of the output voltage of each battery pack.

In the embodiment of the present disclosure, the voltages, the currents, and the number N of the battery packs are arbitrarily selected, and any voltage value, current value, and number can be calculated in the above manner, which are not limited to 180 battery packs. In addition, the number n of the battery packs in the embodiment of the present disclosure can be infinitely large, so as to meet the requirement for expansion of a high capacity of the battery.

Figure 8:
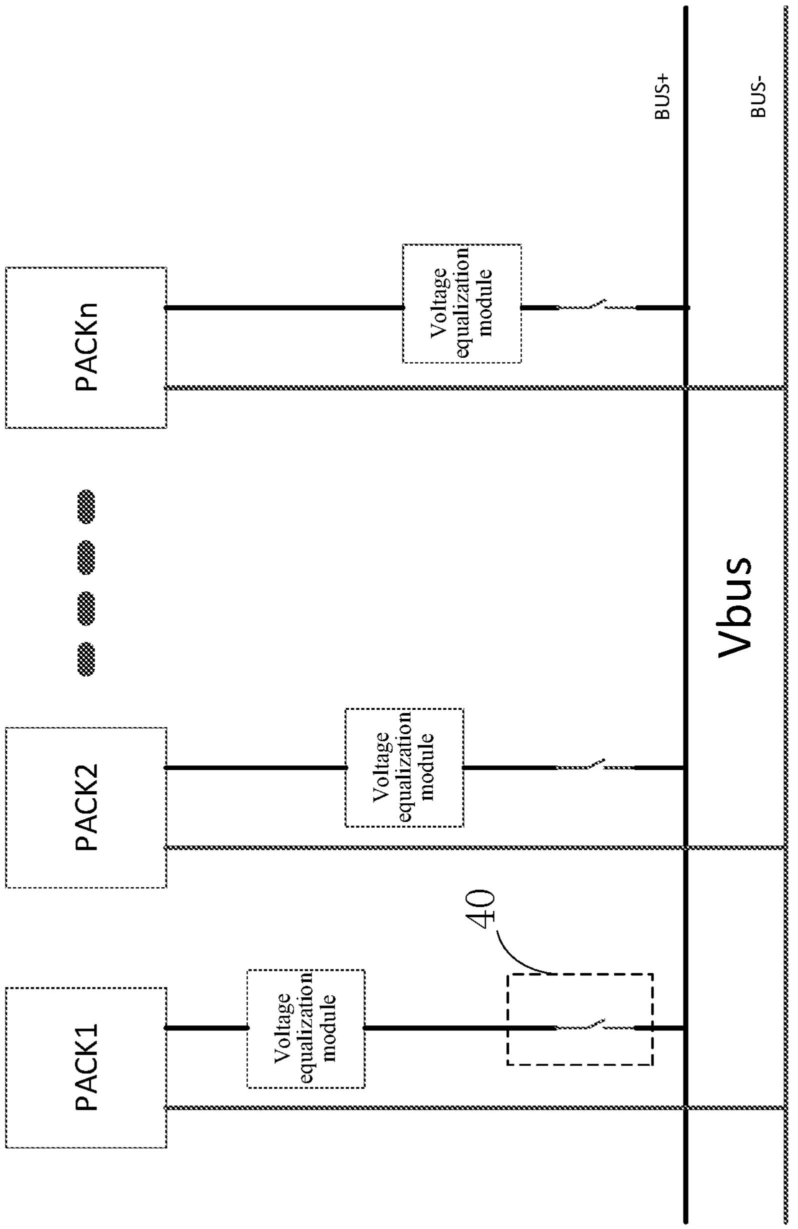
FIG. 8 is a schematic diagram of a charging and discharging system according to an embodiment of the present disclosure.

In practical application, for fault isolation and electrical safety, a disconnecting device may be connected in series in the branch circuit, which may be separately disconnected when a single pack fails or needs to be disconnected manually. As shown in FIG. 8, the charging and discharging system 1 of the embodiment of the present disclosure further includes multiple switch modules 40. The number of the switch modules 40 is the same as the number of the voltage equalization modules 30. The switch modules 40 are connected in series with the voltage equalization modules 30 in a one-to-one correspondence, so that the related circuits can be turned on and off by controlling the switch modules 40. In an embodiment, the switch module 40 can be closed only when it is detected that the output voltages of the battery PACK and the voltage equalization module 30 satisfy Vbus=Va1+Vb1, and the switch module 40 may be a contactor, a semiconductor switch, or the like.

Figure 9:
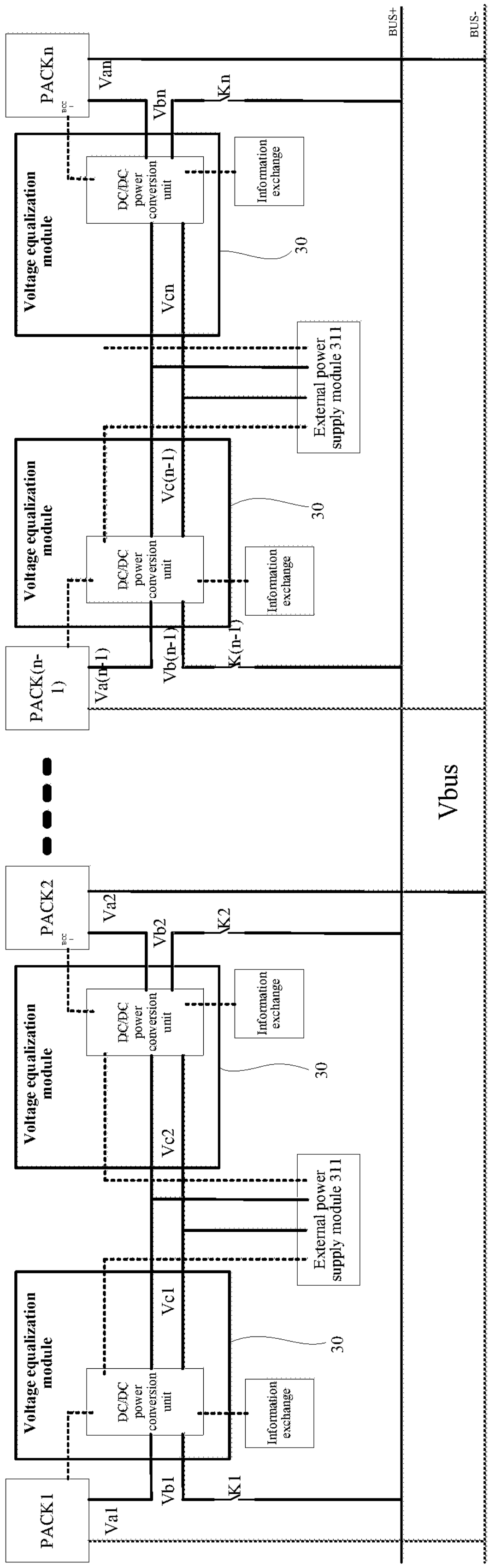
FIG. 9 is a schematic diagram of a charging and discharging system according to an embodiment of the present disclosure.

In the embodiment, as shown in FIG. 9, the charging and discharging system 1 further includes at least one external power supply module 311 for supplying power to the voltage equalization module 30. The at least one external power supply module 311 is connected with the at least one voltage equalization module 30, and is configured to provide a DC supply signal for the voltage equalization module 30. That is to say, the voltage equalization module 30 is powered by a separate power supply module 50, such as a battery pack, so that the power supply of the voltage equalization module 30 is independent of the voltage of the main circuit. Supplying power separately may help reduce a voltage level, facilitate device model selection, and further reduce the cost of a material for a flexible voltage adjustment unit.

In the embodiment, one or more external power supply modules 311 may be arranged. The external power supply module 311 may be a battery pack, such as a battery pack. That is to say, the voltage equalization module 30 not only can be powered by the battery pack connected in series with the voltage equalization module, but also can be powered by a separate external power supply module 311 such as a battery pack. In addition, the battery pack not only can supply power in a one-to-one manner, but also can be arranged for adjacent voltage equalization modules 30, or only one battery pack may be used to supply power to the voltage equalization modules 30.

For example, when one external power supply module 311 is arranged, the external power supply module 311 is connected with the voltage equalization modules 30, and is configured to provide a DC supply signal for each voltage equalization module 30.

In some embodiments, when multiple external power supply modules 311 are arranged, the multiple external power supply module 311 are connected with the voltage equalization modules 30 in a one-to-one correspondence, and are configured to provide a DC supply signal for the voltage equalization modules 30. That is to say, each voltage equalization module 30 is correspondingly provided with one external power supply module 311 to realize one-to-one power supply.

Figure 10:
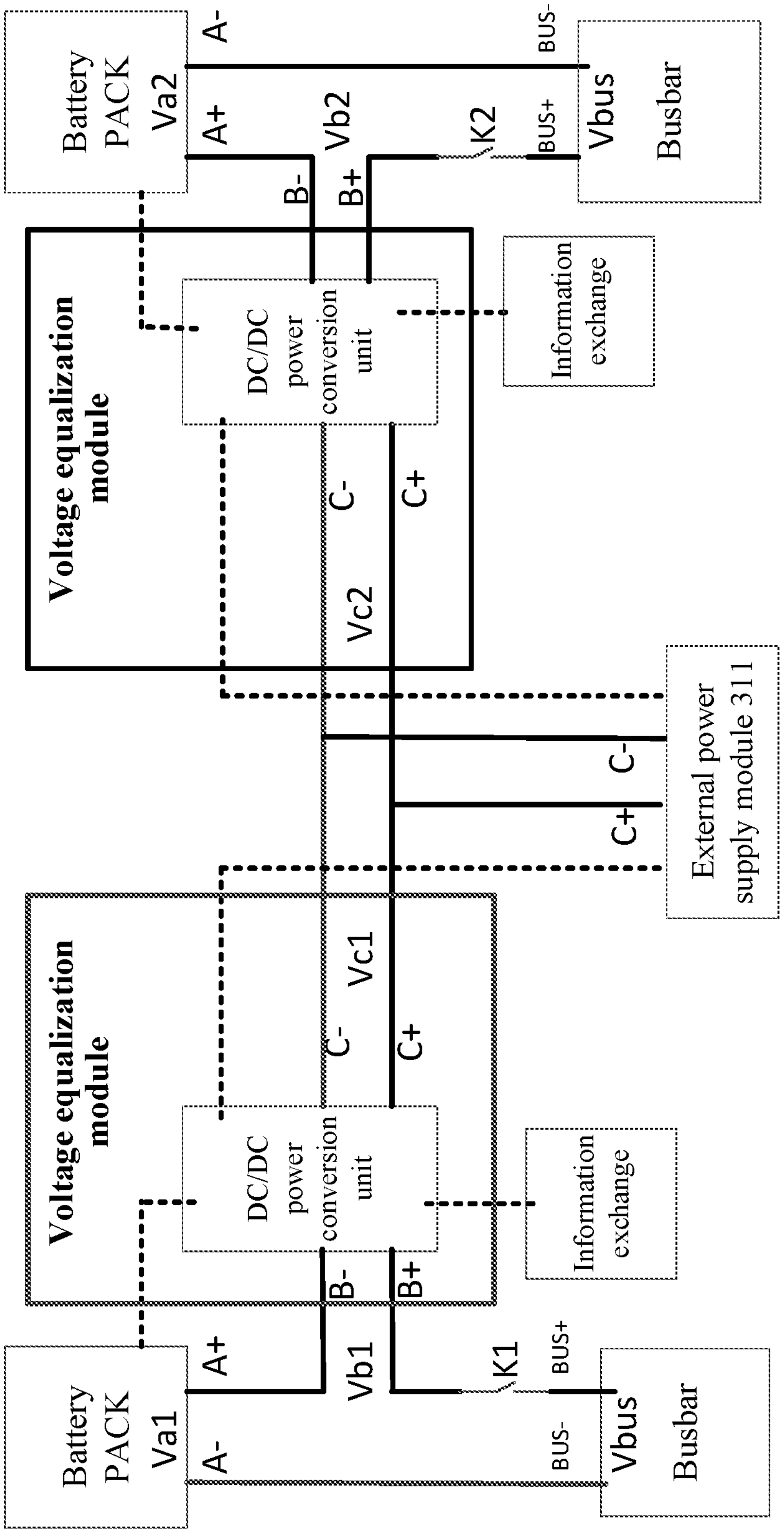
FIG. 10 is a schematic diagram of a charging and discharging system according to an embodiment of the present disclosure.

In some embodiments, one of the multiple external power supply modules 311 is connected with two adjacent voltage equalization modules 3, and is configured to provide DC supply signals for the two adjacent voltage equalization modules 30, as shown in FIG. 9 and FIG. 10.

In some embodiments, the multiple external power supply module 311 may also be used to jointly supply power to one voltage equalization module 30. For example, a battery pack of a branch where the voltage equalization module 30 is located and a correspondingly arranged external battery pack jointly supply power to the voltage equalization module 30.

In general, in the charging and discharging system 1 of the embodiment of the present disclosure, the voltage equalization modules 30 are connected in series, which not only can effectively resolve the problems of safe parallel connection and circulating currents of the batteries connected in parallel, but also can improve the reliability and stability of the system and effectively increase the life of the system. In addition, the output voltage of the voltage equalization module 30 is flexible and controllable. Compared with the solution 2 in the related art, the output power of the voltage equalization module 30 of the present disclosure can be reduced from the original 150 KW to 1.25 KW. That is to say, the power is reduced to 0.8% of the original power and is smaller, the volume can be smaller, and the cost is also reduced, which facilitates mass application and mounting, and realize portable and flexible application. Moreover, a protector connected in parallel is externally mounted on the main circuit of the system. Only a positive electrode or a negative electrode is connected with the main circuit, which will not lose the power of the entire system. The system efficiency can be increased from 98% to 99%, and therefore the system has obvious advantages in improving system efficiency.

In the description of this specification, description of reference terms such as “specific embodiments”, or “a specific example”, means including specific features, structures, materials, or features described in the embodiment or example in at least one embodiment or example of the present disclosure. In this specification, schematic descriptions of the foregoing terms necessarily of the necessarily directed at a same embodiment or example.

Although the embodiments of the present disclosure have been shown and described, persons of ordinary skill in the art should understand that various changes, modifications, replacements and variations may be made to the embodiments without departing from the principles and spirit of the present disclosure, and the scope of the present disclosure is as defined by the appended claims and their equivalents.

What is claimed is:

1. A charging and discharging system, comprising:

a plurality of battery packs, connected in parallel; and one or more voltage equalization modules, wherein each of the battery packs is connected with a voltage equalization module of the one or more voltage equalization modules in series; and a battery assembly comprises the voltage equalization module and a corresponding battery pack connected therewith, and the voltage equalization module is configured to adjust an output voltage of the battery assembly to a target voltage, wherein a positive input terminal of the voltage equalization module is connected with a positive electrode of the corresponding battery pack, a negative input terminal of the voltage equalization module is connected with a negative electrode of the corresponding battery pack, a positive output terminal of the voltage equalization module is connected with the negative electrode of the corresponding battery pack, and a negative output terminal of the voltage equalization module is connected to an external negative electrode of a battery system.

2. The charging and discharging system according to claim 1, wherein the voltage equalization module is a boost equalization module; and the boost equalization module is configured to increase the output voltage of the battery assembly to the target voltage.

3. The charging and discharging system according to claim 1, wherein the voltage equalization module is a buck equalization module; and the buck equalization module is configured to decrease the output voltage of the battery assembly to the target voltage.

4. The charging and discharging system according to claim 1, further comprising at least one external power supply module, wherein the at least one external power supply module is connected with the voltage equalization module, and is configured to provide a DC supply signal for the voltage equalization module.

5. The charging and discharging system according to claim 1, wherein the voltage equalization module comprises:

a voltage regulation unit, which is a boost-buck regulation unit, a boost regulation unit, or a buck regulation unit;

a communication unit, connected with battery management units of the plurality of battery packs and configured to acquire battery parameters of the battery packs;

a current detection unit, configured to detect an output current of the voltage equalization module;

a voltage detection unit, configured to detect an output voltage of the voltage equalization module; and a control unit connected with the communication unit, the current detection unit, and the voltage detection unit and configured to control the voltage regulation unit according to the battery parameters, the output current, and the output voltage, so that the output voltage of the corresponding battery pack and the voltage equalization module that are connected in series is equal to the target voltage.

6. The charging and discharging system according to claim 1, further comprising:

a plurality of switch modules, connected with the voltage equalization modules in series in a one-to-one correspondence.

7. The charging and discharging system according to claim 1, wherein the voltage equalization module is a boost-buck equalization module; and the boost-buck equalization module is configured to increase or decrease the output voltage of the battery assembly to the target voltage.

8. The charging and discharging system according to claim 7, wherein the boost-buck equalization module comprises a boost-buck regulation unit; and the boost-buck regulation unit comprises:

a first converter, configured to convert a direct current (DC) supply signal to an alternating current (AC) signal;

a transformer, comprising a primary side coil and a secondary side coil, wherein the primary side coil of the transformer is connected with an output terminal of the first converter, and is configured to transmit the AC signal;

a second converter, wherein an input terminal of the second converter is connected with the secondary side coil of the transformer, and the second converter is configured to convert the AC signal to a first DC signal; and a voltage value of the first DC signal is equal to an absolute value of a voltage difference between the target voltage and the output voltage of the corresponding battery pack; and a third converter, wherein an input terminal of the third converter is connected with an output terminal of the second converter; the third converter is configured to convert the first DC signal to a second DC signal; an output terminal of the third converter outputs the second DC signal; and a voltage value of the second DC signal is equal to a voltage value of the first DC signal or a negative value of the voltage value of the first DC signal.

9. The charging and discharging system according to claim 1, wherein the corresponding battery pack is connected with a busbar in parallel.

10. The charging and discharging system according to claim 9, wherein a quantity of the battery packs is N; a quantity of the voltage equalization modules is N;

each battery pack of the N battery packs is connected in series with a corresponding voltage equalization modules of the N voltage equalization modules in a one-to-one correspondence, an output voltage of a battery assembly comprising each of the N battery packs and each of the corresponding voltage equalization modules is equal to the target voltage; and the target voltage is a busbar voltage.

11. The charging and discharging system according to claim 9, wherein a quantity of the battery packs is N; a quantity of the voltage equalization modules is N−1; each battery pack of N−1 battery packs is connected in series with a corresponding voltage equalization modules of the N−1 voltage equalization modules in a one-to-one correspondence, an output voltage of a battery assembly comprising each of the N−1 battery packs and the corresponding voltage equalization module is equal to the target voltage; and the target voltage is equal to an output voltage of a battery pack that is not connected in series with the voltage equalization modules.

12. An energy storage system comprising a charging and discharging system, wherein the charging and discharging system comprises:

a plurality of battery packs, connected in parallel; and one or more voltage equalization modules, wherein each of the battery packs is connected with a voltage equalization module of the one or more voltage equalization modules in series; and a battery assembly comprises the voltage equalization module and a corresponding battery pack connected therewith, and the voltage equalization module is configured to adjust an output voltage of the battery assembly to a target voltage, wherein a positive input terminal of the voltage equalization module is connected with a positive electrode of the corresponding battery pack, a negative input terminal of the voltage equalization module is connected with a negative electrode of the corresponding battery pack, a positive output terminal of the voltage equalization module is connected with the negative electrode of the corresponding battery pack, and a negative output terminal of the voltage equalization module is connected to an external negative electrode of a battery system.

13. The energy storage system according to claim 12, wherein the voltage equalization module is a boost equalization module; and the boost equalization module is configured to increase the output voltage of the battery assembly to the target voltage.

14. The energy storage system according to claim 12, wherein the voltage equalization module is a buck equalization module; and the buck equalization module is configured to decrease the output voltage of the battery assembly to the target voltage.

15. The energy storage system according to claim 12, further comprising at least one external power supply module, wherein the at least one external power supply module is connected with the voltage equalization module, and is configured to provide a DC supply signal for the voltage equalization module.

16. The energy storage system according to claim 12, wherein the voltage equalization module is a boost-buck equalization module; and the boost-buck equalization module is configured to increase or decrease the output voltage of the battery assembly to the target voltage.

17. The energy storage system according to claim 16, wherein the boost-buck equalization module comprises a boost-buck regulation unit; and the boost-buck regulation unit comprises:

a first converter, configured to convert a direct current (DC) supply signal to an alternating current (AC) signal;

a transformer, comprising a primary side coil and a secondary side coil, wherein the primary side coil of the transformer is connected with an output terminal of the first converter, and is configured to transmit the AC signal;

a second converter, wherein an input terminal of the second converter is connected with the secondary side coil of the transformer, and the second converter is configured to convert the AC signal to a first DC signal; and a voltage value of the first DC signal is equal to an absolute value of a voltage difference between the target voltage and the output voltage of the corresponding battery pack; and a third converter, wherein an input terminal of the third converter is connected with an output terminal of the second converter; the third converter is configured to convert the first DC signal to a second DC signal; an output terminal of the third converter outputs the second DC signal; and a voltage value of the second DC signal is equal to a voltage value of the first DC signal or a negative value of the voltage value of the first DC signal.

18. The energy storage system according to claim 12, wherein the corresponding battery pack is connected with a busbar in parallel.

19. The energy storage system according to claim 18, wherein a quantity of the battery packs is N; a quantity of the voltage equalization modules is N;

each battery pack of the N battery packs is connected in series with a corresponding voltage equalization modules of the N voltage equalization modules in a one-to-one correspondence, an output voltage of a battery assembly comprising each of the N battery packs and the corresponding voltage equalization module is equal to the target voltage; and the target voltage is a busbar voltage.

20. The energy storage system according to claim 18, wherein a quantity of the battery packs is N; a quantity of the voltage equalization modules is N−1;

each battery pack of N−1 battery packs is connected in series with a corresponding voltage equalization modules of the N−1 voltage equalization modules in a one-to-one correspondence, an output voltage of a battery assembly comprising each of the battery packs and the corresponding voltage equalization module is equal to the target voltage; and the target voltage is equal to an output voltage of a battery pack that is not connected in series with the voltage equalization modules.

* * * * *